United States Patent
Shimizu et al.

(10) Patent No.: US 11,456,023 B2
(45) Date of Patent: Sep. 27, 2022

(54) SEMICONDUCTOR INTEGRATED CIRCUIT AND SEMICONDUCTOR STORAGE DEVICE

(71) Applicant: Kioxia Corporation, Tokyo (JP)

(72) Inventors: Yutaka Shimizu, Yokohama (JP); Satoshi Inoue, Zushi (JP); Isao Fujisawa, Yokohama (JP); Yumi Takada, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/121,231

(22) Filed: Dec. 14, 2020

(65) Prior Publication Data
US 2021/0335401 A1 Oct. 28, 2021

(30) Foreign Application Priority Data
Apr. 28, 2020 (JP) .............................. JP2020-079147

(51) Int. Cl.
G11C 11/08 (2006.01)
G11C 7/10 (2006.01)

(52) U.S. Cl.
CPC .......... *G11C 7/1093* (2013.01); *G11C 7/1087* (2013.01)

(58) Field of Classification Search
CPC ............................ G11C 7/1093; G11C 7/1087
See application file for complete search history.

(56) References Cited

U.S. PATENT DOCUMENTS

| | | | |
|---|---|---|---|
| 4,871,976 A * | 10/1989 | Watanabe | H03F 3/68 330/84 |
| 7,982,537 B2 | 7/2011 | Hayashi et al. | |
| 9,356,562 B2 | 5/2016 | Motamed | |
| 9,431,968 B2 | 8/2016 | Montazer | |
| 9,767,888 B1 | 9/2017 | Ravi et al. | |

(Continued)

FOREIGN PATENT DOCUMENTS

| | | |
|---|---|---|
| JP | 2009-171479 A | 7/2009 |
| JP | 2013-70375 A | 4/2013 |
| JP | 2019-169208 A | 10/2019 |

OTHER PUBLICATIONS

Gupta, M et al., "Bandwidth Extension of High Compliance Current Mirror by Using Compensation Methods", Hindawi Publishing Corporation, vol. 2014, Article ID 274795, https://www.hindawi.com/journals/apec/2014/274795/, pp. 1-8 with cover page.

*Primary Examiner* — Pho M Luu
(74) *Attorney, Agent, or Firm* — Oblon, McClelland, Maier & Neustadt, L.L.P.

(57) ABSTRACT

There is provided a semiconductor integrated circuit including an input circuit. The input circuit includes a first amplifier and a second amplifier. The second amplifier is electrically connected to the first amplifier. The second amplifier includes a first transistor, a second transistor, a third transistor, a fourth transistor, and a time constant providing circuit. The first transistor has a gate electrically connected to a first node of the first amplifier. The second transistor has a gate electrically connected to a second node of the first amplifier. The third transistor is disposed adjacent to a drain of the first transistor. The fourth transistor is disposed adjacent to a drain of the second transistor. The time constant providing circuit is electrically connected between a gate of the third transistor and a drain of the third transistor, a gate of the fourth transistor.

18 Claims, 12 Drawing Sheets

(56) References Cited

U.S. PATENT DOCUMENTS

| | | |
|---|---|---|
| 2013/0069165 A1 | 3/2013 | Nedovic |
| 2015/0187423 A1* | 7/2015 | Kang .................... G11C 16/10 327/306 |
| 2018/0335793 A1 | 11/2018 | Moughabghab |
| 2019/0295661 A1 | 9/2019 | Hirashima et al. |
| 2020/0161045 A1* | 5/2020 | Miller ................ G01R 19/0023 |
| 2020/0265902 A1 | 8/2020 | Hirashima et al. |

\* cited by examiner

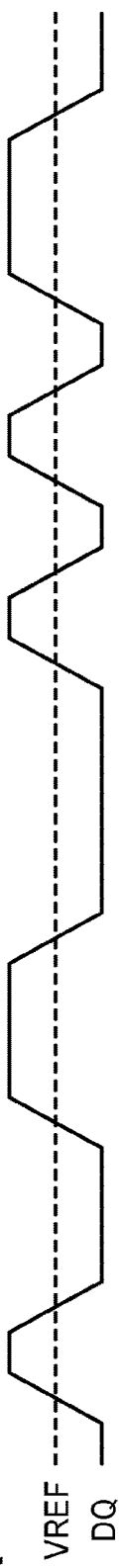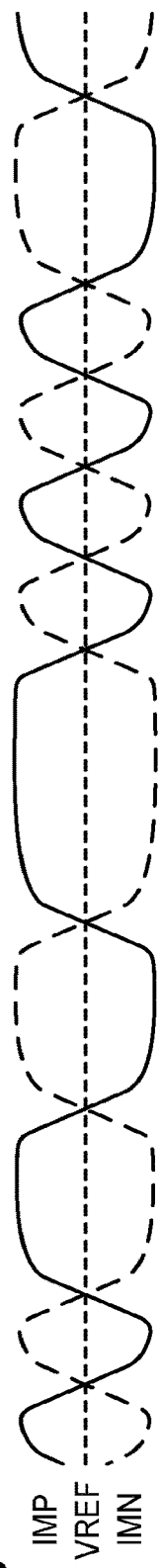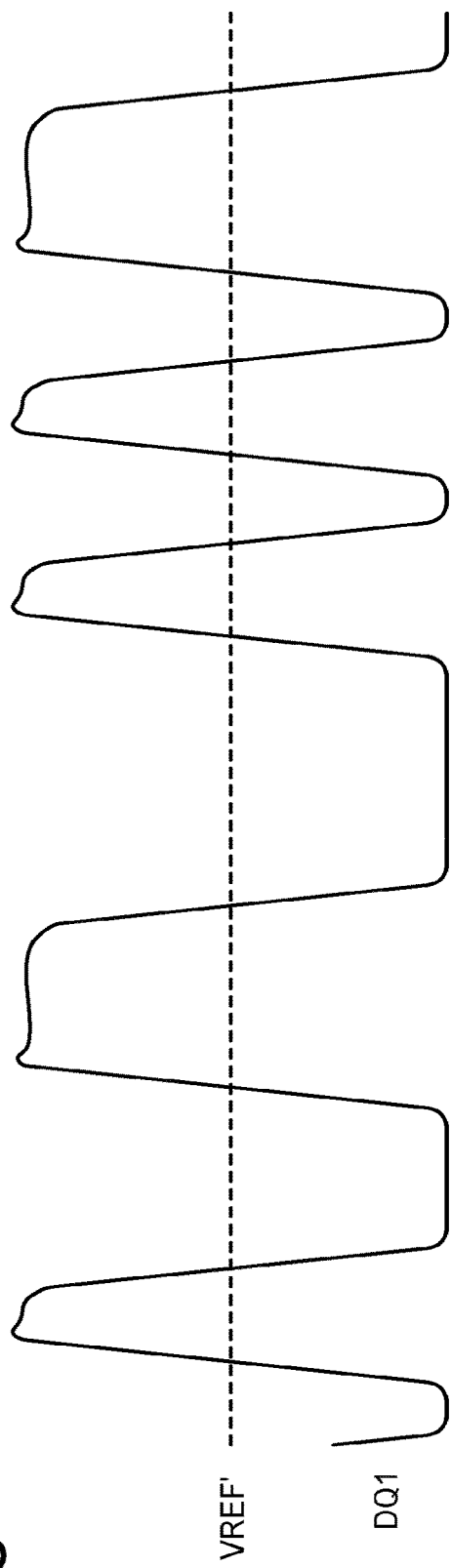
FIG.6A  VREF DQ
FIG.6B  IMP VREF IMN
FIG.6C  VREF' DQ1

SEMICONDUCTOR INTEGRATED CIRCUIT AND SEMICONDUCTOR STORAGE DEVICE

CROSS-REFERENCE TO RELATED APPLICATIONS

This application is based upon and claims the benefit of priority from Japanese Patent Application No. 2020-079147, filed on Apr. 28, 2020; the entire contents of which are incorporated herein by reference.

FIELD

Embodiments described herein relate generally to a semiconductor integrated circuit and a semiconductor storage device.

BACKGROUND

A semiconductor integrated circuit including an input circuit may receive a data signal via the input circuit and transfer the data signal thus received from the input circuit to a subsequent circuit to be used for predetermined operation. The data signal is desired to be appropriately transferred from the input circuit to the subsequent circuit in this case.

BRIEF DESCRIPTION OF THE DRAWINGS

FIGS. 6A to 6C are waveform charts each illustrating operation of the input circuit according the embodiment;

DETAILED DESCRIPTION

In general, according to one embodiment, there is provided a semiconductor integrated circuit including an input circuit. The input circuit includes a first amplifier and a second amplifier. The second amplifier is electrically connected to the first amplifier. The second amplifier includes a first transistor, a second transistor, a third transistor, a fourth transistor, and a time constant providing circuit. The first transistor has a gate electrically connected to a first node of the first amplifier. The second transistor has a gate electrically connected to a second node of the first amplifier. The third transistor is disposed adjacent to a drain of the first transistor. The fourth transistor is disposed adjacent to a drain of the second transistor. The time constant providing circuit is electrically connected between a gate of the third transistor and a drain of the third transistor, a gate of the fourth transistor.

Exemplary embodiments of a semiconductor integrated circuit will be explained below in detail with reference to the accompanying drawings. The present invention is not limited to the following embodiments.

Embodiment

Figure 1:
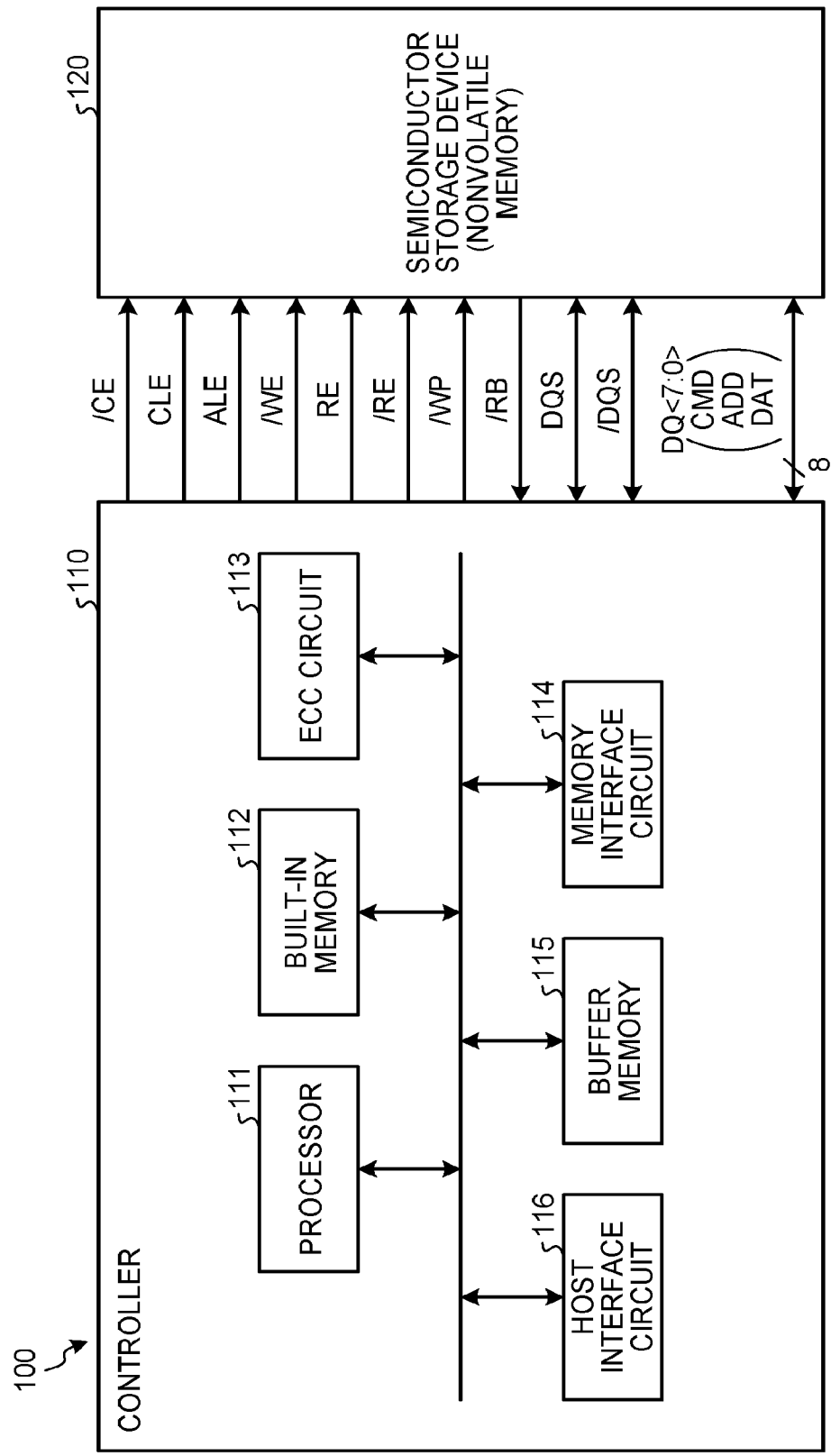
FIG. 1 is a diagram illustrating a configuration of a memory system including a semiconductor storage device provided with a semiconductor integrated circuit according to an embodiment.

The semiconductor integrated circuit according to the embodiment includes the input circuit. The semiconductor integrated circuit may receive a data signal via the input circuit and clock synchronously latch the data signal thus received to be used for predetermined operation. For example, the semiconductor integrated circuit may be applied as a peripheral circuit in a semiconductor storage device 120 having a memory cell array. The semiconductor storage device 120 is applicable to a memory system 100 exemplarily illustrated in FIG. 1. FIG. 1 is a diagram illustrating a configuration of the memory system 100 including the semiconductor storage device 120 provided with the semiconductor integrated circuit.

For example, the memory system 100 may be communicably connected to an external host (not illustrated), to function as an external storage device for the host.

As illustrated in FIG. 1, the memory system 100 includes a controller 110 and the semiconductor storage device 120. The controller 110 receives a command from the host and controls the semiconductor storage device 120 in accordance with the command thus received. Specifically, the controller 110 writes, to the semiconductor storage device 120, data instructed to write by the host, reads, from the semiconductor storage device 120, data instructed to read by the host, and transmits the data thus read to the host. The controller 110 is connected to the semiconductor storage device 120 via a memory bus. The semiconductor storage device 120 is a nonvolatile memory having a memory cell array provided with a plurality of arrayed memory cells and storing data or the like in a nonvolatile manner.

The memory bus transmits and receives, via a separate signal line, each of signals /CE, CLE, ALE, /WE, RE, /RE, /WP, /RB, DQS, /DQS, and DQ<7:0> according to a memory interface. The signal/CE is used to enable the semiconductor storage device 120. The signal CLE is used to notify the semiconductor storage device 120 that the signals DQ<7:0> flowing to the semiconductor storage device 120 while the signal CLE has an "H (High)" level correspond to commands. The signal ALE is used to notify the semiconductor storage device 120 that the signals DQ<7:0> flowing to the semiconductor storage device 120 while the signal ALE has an "H" level correspond to addresses. The signal/WE is used to command the semiconductor storage device 120 to import the signals DQ<7:0> flowing to the semiconductor storage device 120 while the signal/WE has an "L (Low)" level. The signals RE and /RE are complementary signals each used to command the semiconductor storage device 120 to output the signals DQ<7:0>.

The signal/WP is used to command the semiconductor storage device 120 not to write or erase data. The signal /RB indicates whether the semiconductor storage device 120 is in a ready state (of being capable of receiving any external command) or is in a busy state (of being incapable of receiving any external command). The signals DQS and /DQS are complementary signals each used as a strobe signal for control of operation timing of the semiconductor storage device 120 according to the signals DQ<7:0>. The signals DQ<7:0> are data signals of eight bits or the like. Each of the data signals DQ<7:0> is substantial data transmitted and received between the semiconductor storage device 120 and the controller 110, and includes a command CMD, an address ADD, and data DAT. The data DAT includes written data and read data.

The controller 110 includes a processor (central processing unit (CPU)) 111, a built-in memory (random access memory (RAM)) 112, an error check and correction (ECC) circuit 113, a memory interface circuit 114, a buffer memory 115, and a host interface circuit 116.

The processor 111 controls operation of the entire controller 110. The processor 111 issues, to the semiconductor storage device 120, a read command according to the memory interface in response to a data read command received from the host or the like. The processor 111 operates similarly for writing and erasure. The processor 111 also has a function of executing various calculations to read data from the semiconductor storage device 120.

The built-in memory 112 is, for example, a semiconductor memory such as a dynamic RAM (DRAM), and is used as a work area of the processor 111. The built-in memory 112 stores firmware for management of the semiconductor storage device 120, various types of management tables, and the like.

The ECC circuit 113 detects and corrects errors. More specifically, upon writing data, the ECC circuit 113 generates an ECC code for each set of a certain number of pieces of data in accordance with data received from the host. Upon reading data, the ECC circuit 113 executes ECC decoding in accordance with the ECC code and detects whether or not there is any error. If there is found any error, the ECC circuit 113 specifies a bit position of the error and corrects the error.

The memory interface circuit 114 is connected to the semiconductor storage device 120 via the memory bus, and controls communication with the semiconductor storage device 120. The memory interface circuit 114 transmits, to the semiconductor storage device 120, the command CMD, the address ADD, and written data in response to a command from the processor 111. The memory interface circuit 114 also receives read data from the semiconductor storage device 120.

The buffer memory 115 temporarily stores data and the like received by the controller 110 from the semiconductor storage device 120 and the host. The buffer memory 115 is also used as a storage area for temporarily storing read data from the semiconductor storage device 120, a calculation result for the read data, and the like.

The host interface circuit 116 is connected to the host and controls communication with the host. The host interface circuit 116 transfers a command and data received from the host or the like to the processor 111 and the buffer memory 115.

Figure 2:
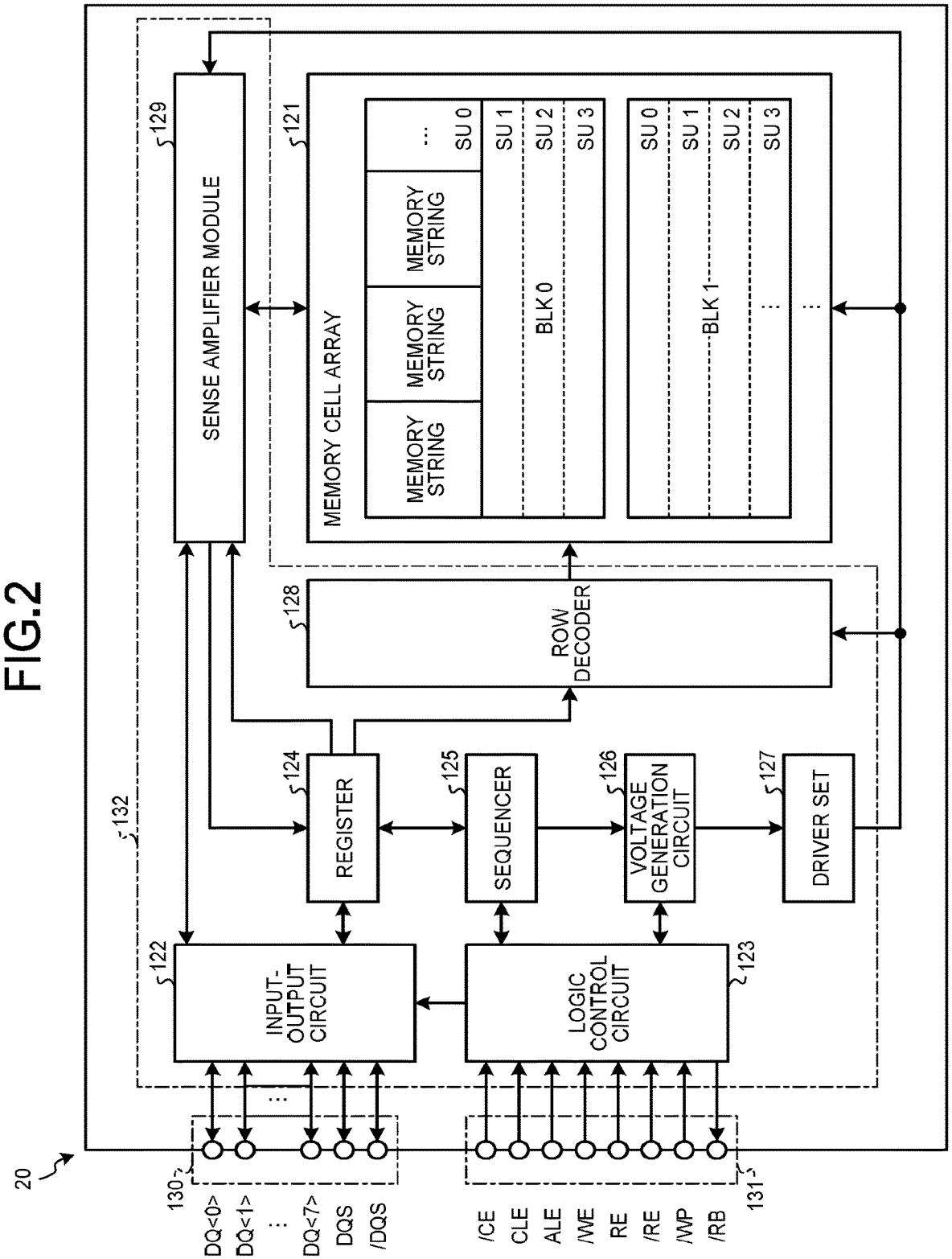
FIG. 2 is a diagram illustrating a configuration of the semiconductor storage device including the semiconductor integrated circuit according the embodiment.

The semiconductor storage device 120 may be configured as illustrated in FIG. 2. FIG. 2 illustrates the configuration of the semiconductor storage device 120.

The semiconductor storage device 120 includes a memory cell array 121, a semiconductor integrated circuit 132, an input-output pin group 130, and a logic control pin group 131. The semiconductor integrated circuit 132 is disposed around the memory cell array 121. The semiconductor integrated circuit 132 is electrically connected between the memory cell array 121 and the input-output pin group 130, the logic control pin group 131.

The semiconductor integrated circuit 132 includes an input-output circuit 122, a logic control circuit 123, a register 124, a sequencer 125, a voltage generation circuit 126, a driver set 127, a row decoder 128, and a sense amplifier module 129.

The memory cell array 121 includes a plurality of nonvolatile memory cells (not illustrated) associated with a word line and a bit line. The plurality of nonvolatile memory cells is subjected to write processing and read processing by a unit called a page, and is subjected to erase processing by units called physical blocks BLK (BLK0, BLK1, . . . ) including a plurality of pages. The physical blocks BLK each have a plurality of string units SU0 to SU3. The string units SU0 to SU3 each function as a drive unit in a corresponding one of the physical blocks BLK. The string units SU0 to SU3 each include a plurality of memory strings. Each memory string MST includes a plurality of memory cell transistors each functioning as a nonvolatile memory cell.

The input-output circuit 122 transmits and receives the data signals DQ<7:0> and the strobe signals DQS and /DQS to and from the controller 110. The input-output circuit 122 confirms a command and an address in each of the data signals DQ<7:0> in accordance with the strobe signals DQS and /DQS, and transfers the command and the address to the register 124. The input-output circuit 122 confirms written data and read data in accordance with the strobe signals DQS and /DQS, and transmits and receives the written data and the read data to and from the sense amplifier module 129.

The logic control circuit 123 receives the signals /CE, CLE, ALE, /WE, RE, /RE, and /WP from the controller 110. The logic control circuit 123 transfers the signal /RB to the controller 110 to externally notify of a state of the semiconductor storage device 120.

The register 124 stores the command and the address. The register 124 transfers the address to the row decoder 128 and the sense amplifier module 129, and transfers the command to the sequencer 125.

The sequencer 125 receives the command, and controls the entire semiconductor storage device 120 in accordance with a sequence according to the command thus received.

The voltage generation circuit 126 generates voltage necessary for operation such as writing, reading, and erasing data in accordance with a command from the sequencer 125. The voltage generation circuit 126 supplies the driver set 127 with the voltage thus generated.

The driver set 127 includes a plurality of drivers, and supplies the row decoder 128 and the sense amplifier module 129 with various voltages from the voltage generation circuit 126 in accordance with the address from the register 124. For example, the driver set 127 supplies the row decoder 128 with various voltages in accordance with a row address included in the address.

The row decoder 128 receives the row address in the address from the register 124, and selects a memory cell in a row according to the row address. The voltage from the driver set 127 is transferred to the memory cell in the row thus selected via the row decoder 128.

Upon reading data, the sense amplifier module 129 senses read data read from the memory cell to the bit line and transfers the read data thus sensed to the input-output circuit 122. Upon writing data, the sense amplifier module 129 transfers written data written via the bit line to the memory cell. The sense amplifier module 129 receives a column address included in the address from the register 124, and outputs data in a column according to the column address.

The input-output pin group 130 transfers, to the input-output circuit 122, the data signals DQ<7:0> and the strobe signals DQS and /DQS received from the controller 110. The input-output pin group 130 transfers, to outside the semiconductor storage device 120, the data signals DQ<7:0> transmitted from the input-output circuit 122.

The logic control pin group 131 transfers, to the logic control circuit 123, the signals /CE, CLE, ALE, /WE, RE, /RE, and /WP received from the controller 110. The logic control pin group 131 transfers, to outside the semiconductor storage device 120, the signal /RB transmitted from the logic control circuit 123.

Figure 3:
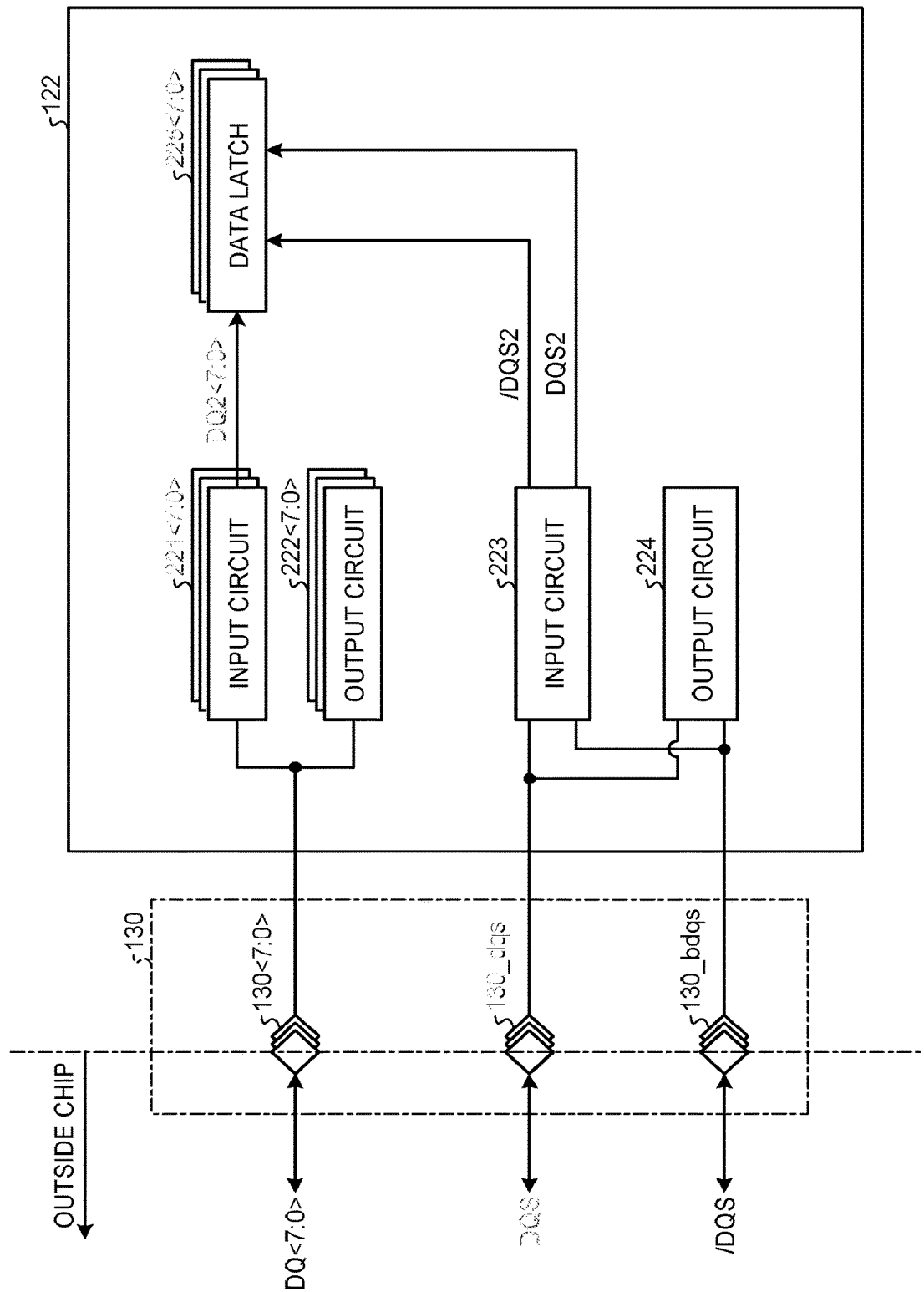
FIG. 3 is a diagram illustrating a configuration of an input-output circuit according the embodiment.

The input-output circuit 122 in the semiconductor storage device 120 may be configured as illustrated in FIG. 3. FIG. 3 is an explanatory block diagram of a functional configuration of the input-output circuit 122.

As illustrated in FIG. 3, the input-output circuit 122 includes input circuits 221<7:0>, output circuits 222<7:0>, an input circuit 223, an output circuit 224, and data latches 225<7:0>. An input circuit 221<k> corresponds to an input circuit for a data signal DQ<k>. The input circuit 223 corresponds to an input circuit for the strobe signals DQS and /DQS.

The data signal DQ<k> or the like is allocated to a single set of the input circuit 221<k> and an output circuit 222<k> (0≤k≤7). The set of the input circuit 221<k> and the output circuit 222<k> may transmit and receive the data signal DQ<k> to and from the external controller 110 via a pin 130<k> included in the input-output pin group 130. When receiving the data signal DQ (<k>, the input circuit 221<k> generates a data signal DQ2<k> and transmits the data signal DQ2<k> to a corresponding data latch 225<k>.

The set of the input circuit 223 and the output circuit 224 may transmit and receive the strobe signal DQS and /DQS to and from the external controller 110 via a pin 130_dqs included in the input-output pin group 130. When receiving the strobe signal DQS and /DQS, the input circuit 223 generates strobe signals /DQS2 and DQS2 and transmits the strobe signals /DQS2 and DQS2 to the data latches 225<7:0>.

When the data latches 225<7:0> receive data signals DQ2<7:0> from the corresponding input circuits 221<7:0> and receive the strobe signals /DQS2 and DQS2 from the input circuit 223, the data latches 225<7:0> latch data included in the data signals DQ<7:0> in accordance with these signals.

Each of the input circuits 221 and 223 is also called an input buffer or an input receiver.

Figure 4:
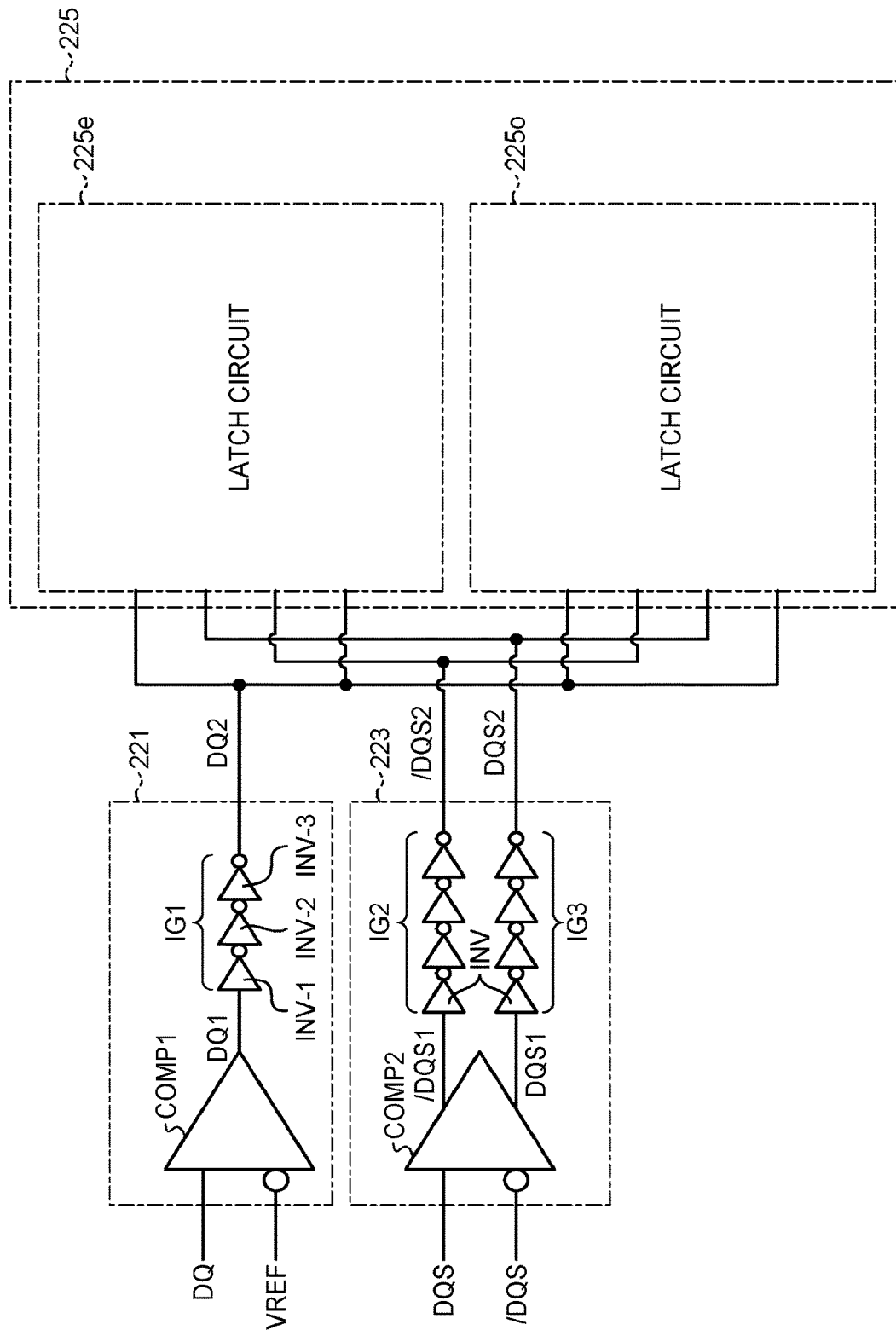
FIG. 4 is a diagram illustrating configurations of input circuits and a data latch according the embodiment.

The input circuits 221 and 223 and the data latch 225 in the input-output circuit 122 may be configured as illustrated in FIG. 4. FIG. 4 is an explanatory circuit diagram of the configurations of the input circuits 221 and 223 and the data latch 225.

The input circuit 221 includes a comparator COMP1 and an inverter group IG1. The input circuit 223 includes a comparator COMP2 and inverter groups IG2 and IG3.

The comparator COMP1 includes a first input end to be supplied with a data signal DQ, a second input end to be supplied with a reference signal VREF, and an output end connected to an input end of the inverter group IG1. The reference signal VREF is reference voltage having a constant value and used as a logical determination threshold of the data signal DQ. The comparator COMP1 compares the data signal DQ and the reference signal VREF, and outputs a data signal DQ1 corresponding to the data signal DQ and having increased amplitude. The inverter group IG1 includes a plurality of inverters INV-1 to INV-3 connected in series, and the inverter INV-3 at a final stage has an output node functioning as an output end for output of a data signal DQ2. In an exemplary case where the inverter group IG1 includes an odd number of inverters, the inverter group IG1 generates a data signal DQ2 having logic obtained by inverting logic of the data signal DQ1 outputted from the comparator COMP1, and outputs the data signal DQ2 from the output end.

The comparator COMP2 includes a first input end to be supplied with the strobe signal DQS, a second input end to be supplied with the strobe signal /DQS, a first output end connected to an input end of the inverter group IG2, and a second output end connected to an input end of the inverter group IG3. The comparator COMP2 compares the strobe signal DQS and the strobe signal /DQS, outputs, from the first output end, a strobe signal /DQS1 corresponding to the strobe signal /DQS and having increased amplitude, and outputs, from the second output end, a strobe signal DQS1 corresponding to the strobe signal DQS and having increased amplitude. Each of the inverter groups IG2 and IG3 includes a plurality of inverters INV connected in series, and the inverter INV at a final stage has an output node functioning as an output end for output of the strobe signals /DQS2 and DQS2. Each of the inverter groups IG2 and IG3 includes a plurality of inverters INV connected in series, and the inverter INV at a final stage has an output node functioning as an output end for output of the strobe signals /DQS2 and DQS2. In an exemplary case where the inverter groups IG2 and IG3 each include an even number of inverters, the inverter groups IG2 and IG3 each generate strobe signals /DQS2 and DQS2 having logic identical to logic of the strobe signals /DQS1 and DQS1 outputted from the comparator COMP2. For example, the strobe signals /DQS2 and DQS2 are logically opposite.

The data latch 225 includes a latch circuit 225e and a latch circuit 225o. The latch circuit 225e and the latch circuit 225o are configured to receive the strobe signals /DQS2 and DQS2 opposite in logic. Accordingly, the latch circuit 225e and the latch circuit 225o alternately latch data pieces adjacent to each other among data pieces included in the data signal DQ2. In a case where the latch circuit 225e latches data in an even number order included in the data signal DQ2, the latch circuit 225o latches data in an odd number order included in the data signal DQ2.

The semiconductor integrated circuit 132 are demanded to have speed increase and low power consumption of the input-output circuit 122.

When a high-speed data signal DQ is inputted to the input circuit 221 for satisfaction of such a speed increase demand, due to jitter of the data signal DQ2 transferred from the input circuit 221 to the data latch 225, an erroneous data value may be latched with insufficient setup time and hold time for data latching.

In contrast, increase in power current supplied to the input circuit 221 enables amplification of the input data signal DQ with a large gain in a wide band, and improvement in slew rate of an output data signal VOUT, for suppression of the jitter of the data signal DQ2 transferred to the data latch 225. It is difficult to satisfy the demand for low power consumption of the input-output circuit 122 in this case. It is desired to achieve suppression of both jitter and power consumption, and appropriately transfer a data signal from the input circuit 221 to the data latch 225 as a subsequent circuit.

In view of this, the comparator COMP1 in the input circuit 221 in the semiconductor integrated circuit 132 according to the present embodiment additionally includes a time constant providing circuit and enables improvement in internal signal transmission characteristics, in order to achieve suppression of both jitter and power consumption.

Specifically, the comparator COMP1 in the input circuit 221 is provided therein with a first amplifier and a second amplifier, and the time constant providing circuit is additionally arranged between a load circuit in the second amplifier and an intermediate node. The time constant providing circuit adds a time constant between the load circuit and the intermediate node for improvement in characteristics of signal transmission from the load circuit to the intermediate node. For example, the time constant providing circuit provides the time constant between the load circuit and the intermediate node to advance a phase of a signal waveform. This leads to stepper waveform transition of a data signal from the load circuit in the second amplifier to the intermediate node and improvement in slew rate. In other words, this achieves amplification of the input data signal DQ with a large gain in a wide band and improvement in slew rate of the output data signal DQ1 without increase in power current supplied to the input circuit 221. The data signal DQ2 transferred to the data latch 225 may have suppressed jitter, for achievement of suppression of both jitter and power consumption. The data signal may be appropriately transferred from the input circuit 221 to the data latch 225 as a subsequent circuit.

Figure 5:
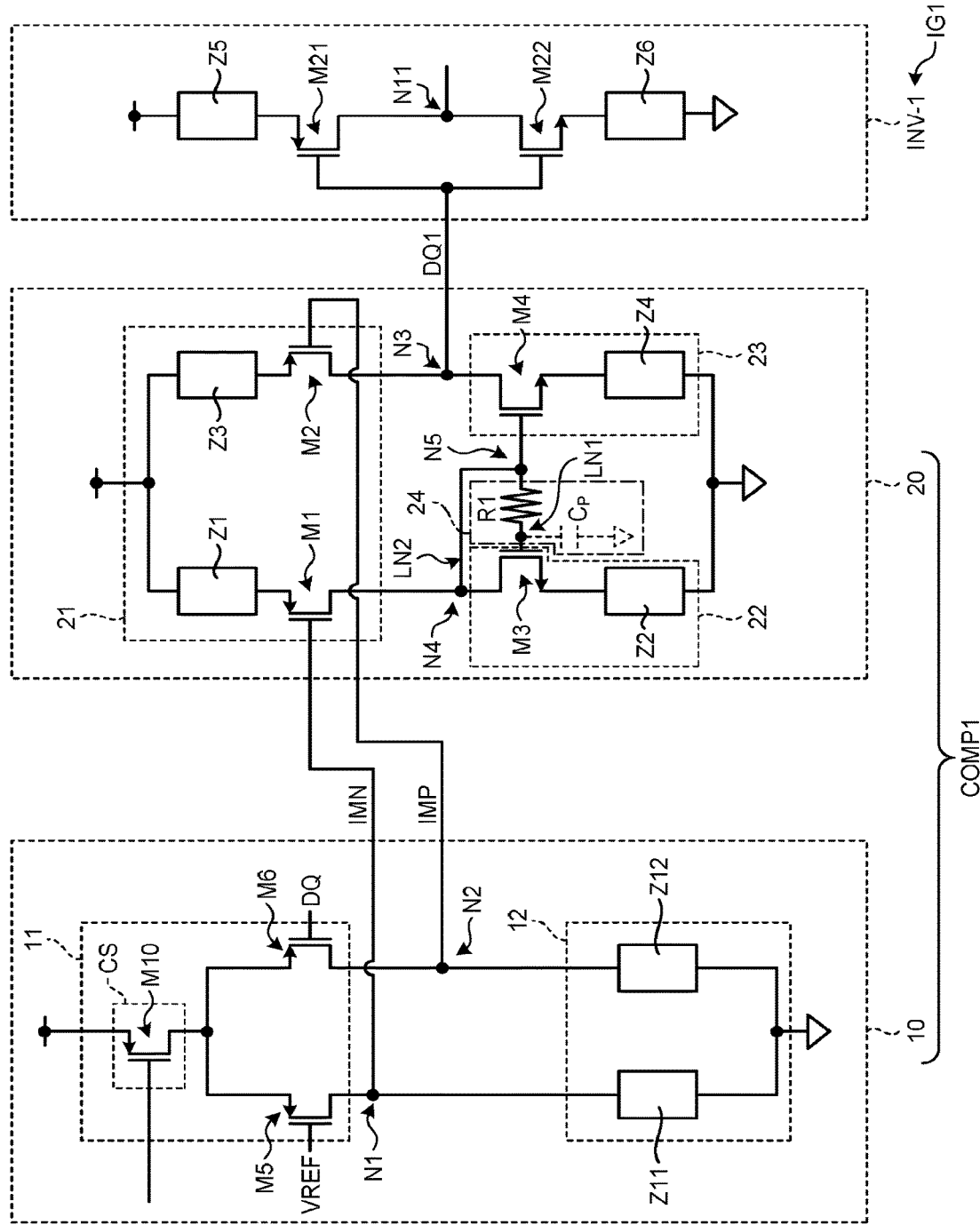
FIG. 5 is a diagram illustrating the configuration of the input circuit according the embodiment.

More specifically, the input circuit 221 may be configured as illustrated in FIG. 5 or the like. FIG. 5 illustrates an exemplary configuration of the input circuit 221. The comparator COMP1 in the input circuit 221 has a first amplifier 10 and a second amplifier 20. The second amplifier 20 is electrically connected to the first amplifier 10.

The first amplifier 10 is of a type of single input and differential output. The first amplifier 10 includes a differential circuit 11 and a load circuit 12. The differential circuit 11 is disposed between power potential and the load circuit 12. The load circuit 12 is disposed between the differential circuit 11 and ground potential. The differential circuit 11 and the load circuit 12 are electrically connected to each other via nodes N1 and N2. The nodes N1 and N2 correspond to a differentially N side and a differentially P side. The first amplifier 10 receives the data signal DQ and the reference signal VREF, generates differential signals IMN and IMP according to the data signal DQ, and outputs the differential signals IMN and IMP to the second amplifier 20 via the nodes N1 and N2.

For example, as illustrated in FIGS. 6A and 6B, the first amplifier 10 raises the P-side signal IMP to be higher than the reference signal VREF and lowers the N-side signal IMN to be lower than the reference signal VREF in accordance with a fact that the data signal DQ is lower than the reference signal VREF. The first amplifier 10 lowers the P-side signal IMP to be lower than the reference signal VREF and raises the N-side signal IMN to be higher than the reference signal VREF in accordance with a fact that the data signal DQ is higher than the reference signal VREF. The first amplifier 10 thus transforms, the data signal DQ as a single signal into differential signals, namely, the P-side signal IMP and the N-side signal IMN.

The differential circuit 11 illustrated in FIG. 5 includes a transistor M5, a transistor M6, and a current source CS. The transistor M5 and the transistor M6 constitute a differential pair. Each of the transistor M5 and the transistor M6 may be constituted by a PMOS transistor. The transistor M5 has a gate to receive the reference signal VREF, a drain electrically connected to the node N1, and a source electrically connected to a first end of the current source CS. The transistor M6 has a gate to receive the data signal DQ, a drain electrically connected to the node N2, and a source electrically connected to the first end of the current source CS. The gate of the transistor M6 constitutes an input node for the data signal DQ in the comparator COMP1, whereas the gate of the transistor M5 constitutes an input node for the reference signal VREF in the comparator COMP1. The current source CS has a second end electrically connected to the power potential. The current source CS may be constituted by a transistor M10 such as a PMOS transistor. The transistor M10 has a gate to receive a predetermined bias signal, a drain electrically connected to the transistor M5 and the transistor M6, and a source electrically connected to the power potential.

The load circuit 12 includes an element Z11 and an element Z12. Each of the element Z11 and the element Z12 may be constituted by a resistance element, or an NMOS transistor having a gate supplied with a predetermined bias. The element Z11 has a first end electrically connected to the node N1, and a second end electrically connected to the ground potential. The element Z12 has a first end electrically connected to the node N2, and a second end electrically connected to the ground potential.

The second amplifier 20 is of a type of differential input and single output. The second amplifier 20 includes a differential circuit 21, a load circuit 22, a load circuit 23, and a time constant providing circuit 24. The differential circuit 21 is disposed between the power potential and the load circuits 22 and 23. The load circuit 22 corresponds to a load circuit on the differentially N side, and is provided for the N-side signal IMN. The load circuit 23 corresponds to a load circuit on the differentially P side, and is provided for the P-side signal IMP. Each of the load circuit 22 and the load circuit 23 is disposed between the differential circuit 21 and the ground potential. The differential circuit 21 and the load circuit 22 are electrically connected to each other via a node N4. The differential circuit 21 and the load circuit 23 are electrically connected to each other via a node N3. The node N3 constitutes an output node of the comparator COMP'.

The time constant providing circuit 24 is disposed between the load circuit 22 and a node N5, and is electrically connected between the load circuit 22 and the node N5. The node N5 is electrically connected to the node N4, the time constant providing circuit 24, and the load circuit 23, and constitutes an intermediate node of the second amplifier 20. Accordingly, the time constant providing circuit 24 may add the time constant between the load circuit 22 and the node N5, and may improve characteristics of signal transmission from the node N4 to the node N3 (output node) via the node N5 (intermediate node).

The differential circuit 21 includes a transistor M1, a transistor M2, an element Z1, and an element Z3. The transistor M1 and the transistor M2 constitute a differential pair. Each of the transistor M1 and the transistor M2 may be constituted by a PMOS transistor. The transistor M1 has a gate to receive the N-side signal IMN, a drain electrically connected to the node N4, and a source electrically connected to a first end of the element Z1. The element Z1 has the first end electrically connected to the transistor M1, and a second end electrically connected to the power potential. The transistor M2 has a gate to receive the P-side signal IMP, a drain electrically connected to the node N3, and a source electrically connected to a first end of the element Z3. The element Z3 has the first end electrically connected to the transistor M2, and a second end electrically connected to the power potential.

The load circuit 22 includes a transistor M3 and an element Z2. The transistor M3 may be constituted by an NMOS transistor. The transistor M3 has a gate electrically connected to the node N5 via the time constant providing circuit 24, a drain electrically connected to the node N4, and a source electrically connected to a first end of the element Z2. The element Z2 has the first end electrically connected to the transistor M3, and a second end electrically connected to the ground potential.

The load circuit 23 includes a transistor M4 and an element Z4. The transistor M4 may be constituted by an NMOS transistor. The transistor M4 has a gate electrically connected to the node N5, a drain electrically connected to the node N3, and a source electrically connected to a first end of the element Z4. The element Z4 has the first end electrically connected to the transistor M4, and a second end electrically connected to the ground potential.

The transistor M3 and the transistor M4 constitute a current mirror circuit via the time constant providing circuit 24. Current according to a predetermined mirror ratio to current flowing in the node N4 flows to the node N3. Specifically, regarding the node N3, the N-side signal IMN is transmitted through the transistor M1→the node N4→the load circuit 22 (transistor M3) and the time constant providing circuit 24→the node N5→the load circuit 23 (transistor M4)→the node N3, and the P-side signal IMP is transmitted through the transistor M2→the node N3. The node N3 outputs, to the inverter INV-1, a difference between the N-side signal and the P-side signal as the output data signal DQ1.

The inverter INV-1 includes transistors M21 and M22 and elements Z5 and Z6 being inverter connected. The transistor M21 is constituted by a PMOS transistor, and has a gate electrically connected to the node N3, a drain electrically connected to the node N11, and a source electrically connected to a first end of the element Z5. The element Z5 has the first end electrically connected to the transistor M21, and a second end electrically connected to the power potential. The transistor M22 is constituted by an NMOS transistor, and has a gate electrically connected to the node N3, a drain electrically connected to the node N11, and a source electrically connected to a first end of the element Z6. The element Z6 has the first end electrically connected to the transistor M22, and a second end electrically connected to the ground potential.

For example, as illustrated in FIGS. 6B and 6C, the second amplifier 20 lowers the output data signal DQ1 to be significantly lower than a reference signal VREF' in accordance with a fact that the N-side signal IMN is lower than the P-side signal IMP. The second amplifier 20 raises the output data signal DQ1 to be significantly higher than the reference signal VREF' in accordance with a fact that the N-side signal IMN is higher than the P-side signal IMP. The second amplifier 20 thus transforms the P-side signal IMP and the N-side signal IMN as differential signals into a single signal, namely, the output data signal DQ1.

The time constant providing circuit 24 illustrated in FIG. 5 adds the time constant between the transistor M3 and the node N5 in this case. The time constant providing circuit 24 and the load circuit 22 are configured such that equivalent impedance observed from the node N4 becomes inductive. The time constant providing circuit 24 includes a resistance element R1, and further equivalently includes parasitic capacitance Cp. The resistance element R1 has a first end electrically connected to the gate of the transistor M3, and a second end electrically connected to the node N5. The resistance element R1 has a resistance value in a kΩ order, and, for example, the resistance value is about several kΩ. The parasitic capacitance Cp is an equivalent capacitance component parasitically arranged between the ground potential and a line LN1, the transistor M3. The line LN1 electrically connects the gate of the transistor M3 and the first end of the resistance element R1.

Figure 7A:
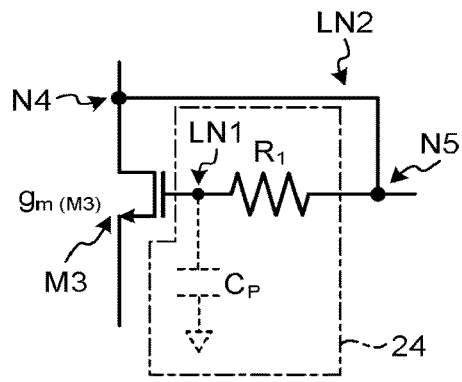
FIGS. 7A to 7D are diagrams illustrating configurations of part of the input circuit and an equivalent circuit thereof according the embodiment.
Figure 7B:
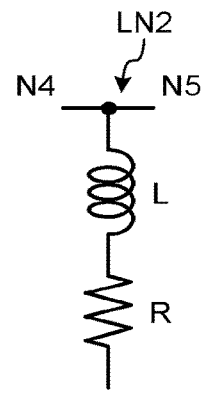

For example, as illustrated in FIG. 7A, the transistor M3 equivalently functions as mutual conductance $g_{m(M3)}$. Such a configuration including a first end of the parasitic capacitance Cp and the first end of the resistance element R1 connected to the gate of the transistor M3 equivalently functions as a configuration including an inductive element L and the resistance element R connected in series being shunt connected to a line LN2 as illustrated in FIG. 7B. The time constant providing circuit 24 and the load circuit 22 substantially function as the inductive element L.

The inductive element L has an inductance value expressed by Equation 1 below, and the resistance value of the resistance element R is expressed by Equation 2 below.

$$L=(Cp \cdot R1)/(g_{m(M3)}) \qquad \text{Equation 1}$$

$$R=1/g_{m(M3)} \qquad \text{Equation 2}$$

Equation 1 includes Cp indicating a capacitance value of the parasitic capacitance Cp, and R1 indicating the resistance value of the resistance element R1. Equation 1 and Equation 2 each include $g_{m(M3)}$ indicating a mutual conductance value of the transistor M3.

Figure 7C:
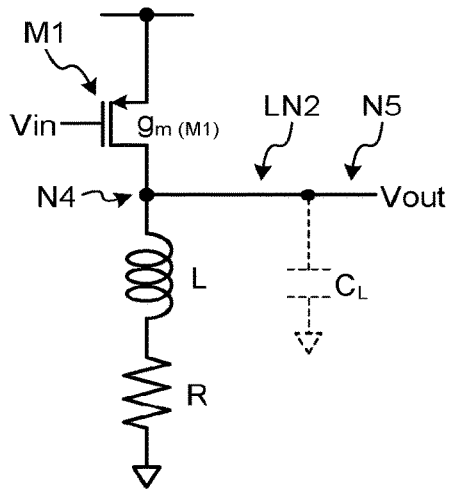
Figure 7D:
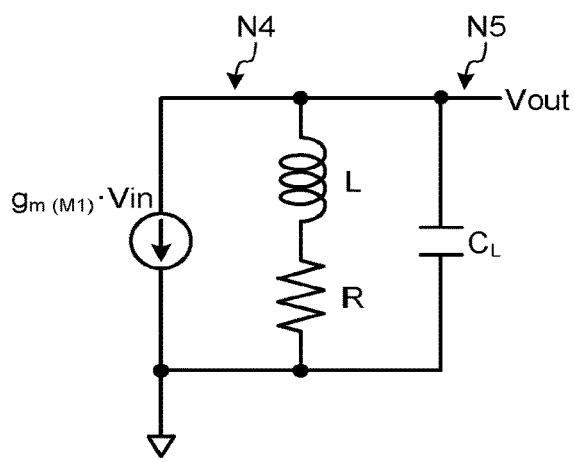

FIG. 7C is obtained by including the configuration illustrated in FIG. 7B and additionally including the transistor M1. In this configuration, the transistor M1 equivalently functions as mutual conductance $g_{m(M1)}$. Assume that $C_L$ denotes synthetic capacitance of the capacitance component parasitically generated between the line LN2 and the ground potential and the element connected to Vout, $V_{in}$ denotes a signal inputted to the gate of the transistor M1, and $V_{out}$ denotes a signal outputted from the node N5. The configuration including the inductive element L and the resistance element R connected in series and the line LN2 that are connected to the drain of the transistor M1 via the node N4 equivalently functions as a configuration including a current source having a current value $g_{m(M1)} \cdot V_{in}$, the inductive element L and the resistance element R connected in series, and the parasitic capacitance $C_L$ that are connected parallelly between the ground potential and the node N5, as illustrated in FIG. 7D. The input signal $V_{in}$ and the output signal $V_{out}$ in the configuration illustrated in FIG. 7D have a transfer function H(s) expressed by Equation 3 below.

$$H(s)=-g_{m(M1)} \cdot \{(R+sL)/(s^2LC_L+sRC_L+1)\} \qquad \text{Equation 3}$$

Meanwhile, the input signal $V_{in}$ and the output signal $V_{out}$ in the configuration obtained by removing the inductive element L from FIG. 7D have a transfer function H(s) expressed by Equation 4 below.

$$H(s)=-g_{m(M1)} \cdot \{R/(sRC_L+1)\} \qquad \text{Equation 4}$$

Figure 8:
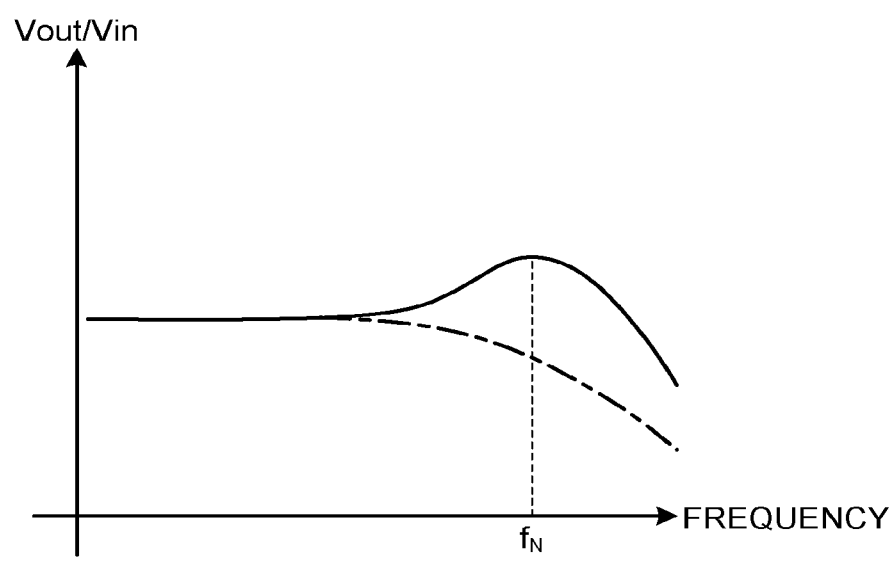
FIG. 8 is a graph illustrating frequency characteristics of the input circuit according the embodiment.

Equation 4 indicates that the configuration obtained by removing the inductive element L from FIG. 7D has frequency characteristic including no zero and one pole, as illustrated by a dashed line in FIG. 8. FIG. 8 illustrates frequency characteristics of Equation 3 and Equation 4, having an ordinate axis indicating a circuit gain and a transverse axis indicating a frequency level. The frequency characteristics illustrated by the dashed line in FIG. 8 tend to be attenuated in signal strength at a desired frequency $f_N$.

In contrast, the frequency characteristics of the configuration illustrated in FIG. 7D according to Equation 3 are increased by one zero and one pole, and as illustrated by a solid line in FIG. 8, attenuation of the gain is suppressed on a slightly lower frequency side of the frequency $f_N$ and the gain may be secured at the desired frequency $f_N$. For example, a frequency of zero is slightly lower than the frequency $f_N$, the gain tends to be slightly increased near the frequency of the zero, a frequency of pole is near the frequency $f_N$ and the gain changes to tend to be decreased at the frequency of pole. The frequency characteristics illustrated by the solid line in FIG. 8 may be attenuated in signal strength at the desired frequency $f_N$.

Figure 9A:
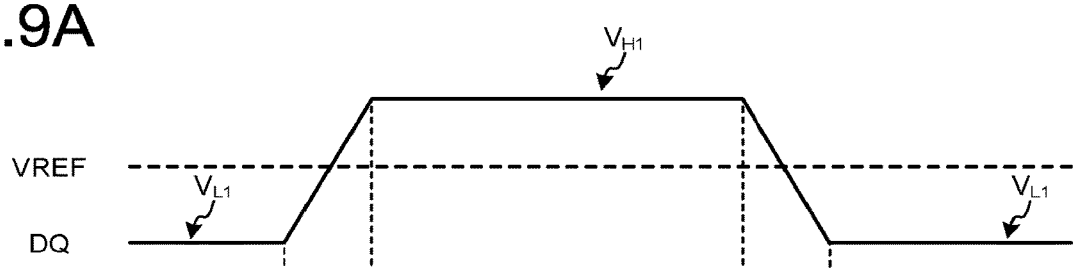
FIGS. 9A to 9D are waveform charts each illustrating operation of the input circuit according the embodiment.
Figure 9B:
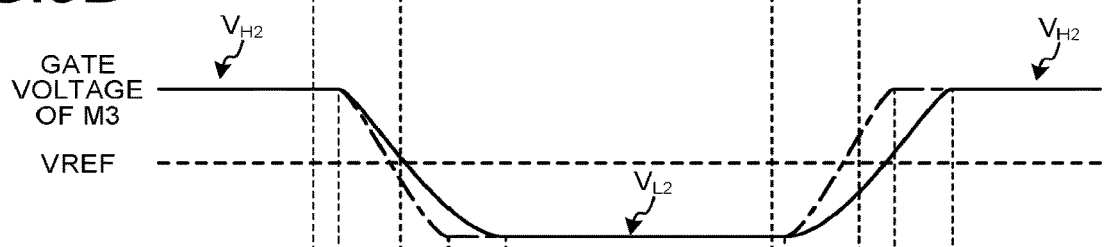
Figure 9C:
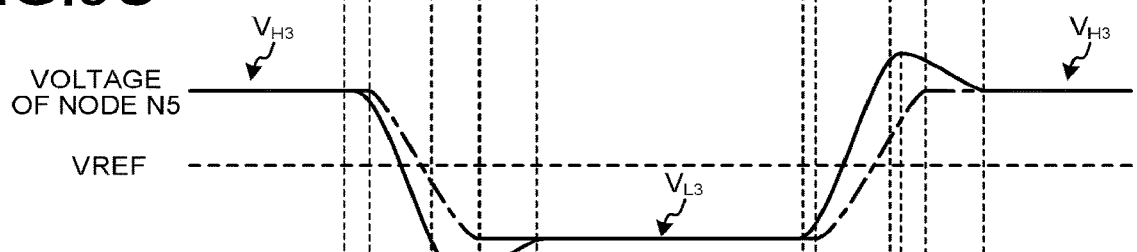
Figure 9D:
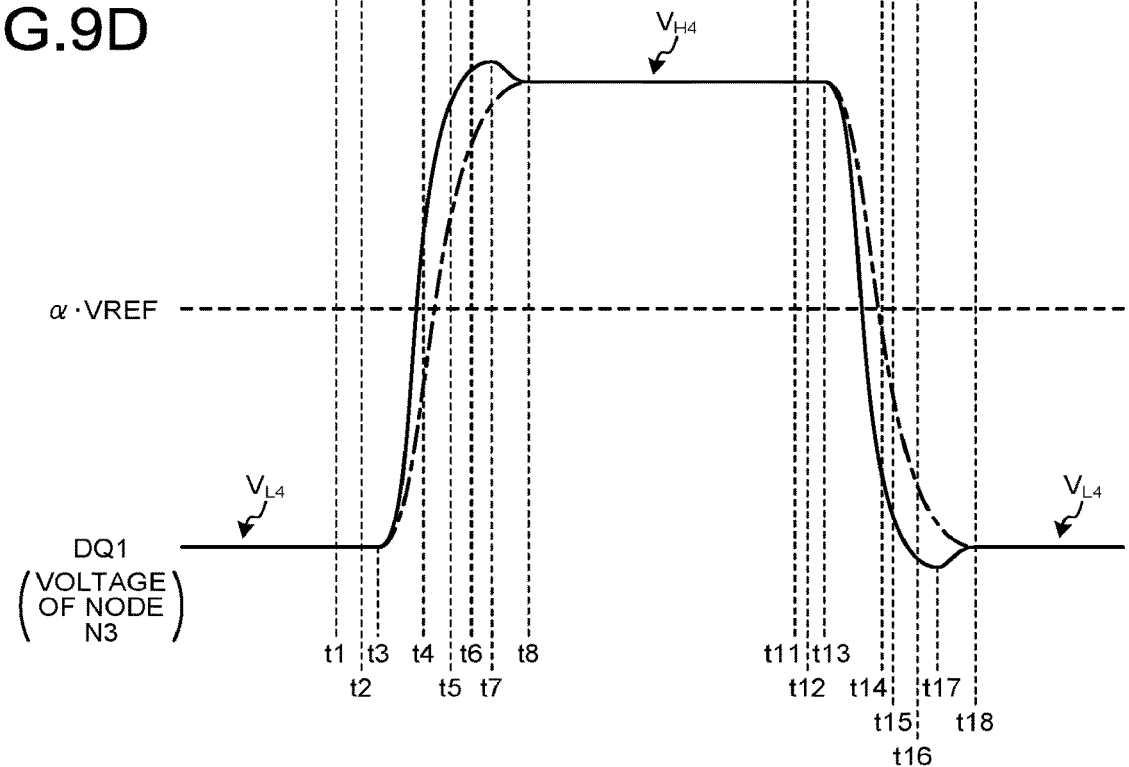

FIGS. 9A to 9D illustrate signal waveforms thereof. FIGS. 9A to 9D are waveform charts each illustrating operation of the input circuit according the embodiment; FIG. 9A illustrates waveforms of the data signal DQ and the reference signal VREF inputted to the first amplifier 10. FIG. 9B illustrates a waveform of gate potential of the transistor M3. FIG. 9C illustrates a waveform of the potential of the node N5, and may be regarded as a waveform of gate potential of the transistor M4. FIG. 9D illustrates a waveform of the output data signal DQ1, and may be regarded as a waveform of the potential of the node N3.

During a period from timing t1 to timing t4 illustrated in FIG. 9A, the data signal DQ received by the comparator COMP1 has transition from an L level $V_{L1}$ to an H level $V_{H1}$.

Assume a configuration obtained by removing the time constant providing circuit 24 from FIG. 5. As illustrated by a dashed line in FIG. 9B, the gate potential of the transistor M3 in the load circuit 22 in this configuration has transition from an H level $V_{H2}$ to an L level $V_{L2}$ during a period from timing t2 to timing t6 later than the period from the timing t1 to the timing t4. Furthermore, as illustrated by a dashed line in FIG. 9C, the potential of the node N5 has transition from an H level $V_{H3}$ to an L level $V_{L3}$ during the period from the timing t2 to the timing t6. Accordingly, as illustrated by a dashed line in FIG. 9D, the output data signal DQ1 has transition from an L level $V_{L4}$ to an H level $V_{H4}$ during a period from timing t3 to timing t8 later than the period from the timing t2 to the timing t6.

In contrast, in the configuration illustrated in FIG. 5 including the time constant providing circuit 24, the waveform of the gate potential of the transistor M3 has gentler inclination as illustrated by a solid line in FIG. 9B, whereas the waveform of the potential of the node N5 may be undershot to have steeper inclination as illustrated by a solid line in FIG. 9C. The gate potential of the transistor M3 has transition from the H level $V_{H2}$ to the L level $V_{L2}$ during a later period from the timing t2 to the timing t8, and the potential of the node N5 has transition from the H level $V_{H3}$ to the L level $V_{L3}$ during an earlier period from the timing t2 to timing t5. Accordingly, as illustrated by a solid line in FIG. 9D, the output data signal DQ1 has transition from the L level $V_{L4}$ to the H level $V_{H4}$ during an earlier period from the timing t3 to timing t7.

In other words, this achieves amplification of the input data signal DQ with a large gain in a wide band and improvement in rising slew rate of the waveform of the output data signal DQ1 without increase in power current supplied to the input circuit 221. The data signal DQ2 transferred to the data latch 225 may thus have suppressed jitter at low power consumption.

Furthermore, during a period from timing t11 to timing t14 illustrated in FIG. 9A, the data signal DQ received by the comparator COMP1 has transition from the H level $V_{H1}$ to the L level $V_{L1}$.

Assume a configuration obtained by removing the time constant providing circuit 24 from FIG. 5. As illustrated by the dashed line in FIG. 9B, the gate potential of the transistor M3 in the load circuit 22 in this configuration has transition from the L level $V_{L2}$ to the H level $V_{H2}$ during a period from timing t12 to timing t16 later than the period from the timing t11 to the timing t14. Furthermore, as illustrated by the dashed line in FIG. 9C, the potential of the node N5 has transition from the L level $V_{L3}$ to the H level $V_{H3}$ during the period from the timing t12 to the timing t16. Accordingly, as illustrated by the dashed line in FIG. 9D, the output data signal DQ1 has transition from the H level $V_{H4}$ to the L level $V_{L4}$ during a period from timing t13 to timing t18 later than the period from the timing t12 to the timing t16.

In contrast, in the configuration illustrated in FIG. 5 including the time constant providing circuit 24, the waveform of the gate potential of the transistor M3 has gentler inclination as illustrated by a solid line in FIG. 9B, whereas the waveform of the potential of the node N5 may be overshot to have steeper inclination as illustrated by a solid line in FIG. 9C. The gate potential of the transistor M3 has transition from the L level $V_{L2}$ to the H level $V_{H2}$ during a later period from the timing t12 to the timing t18, and the potential of the node N5 has transition from the L level $V_{L3}$ to the H level $V_{H3}$ during an earlier period from the timing t12 to timing t15. Accordingly, as illustrated by the solid line in FIG. 9D, the output data signal DQ1 has transition from the H level $V_{H4}$ to the L level $V_{L4}$ during an earlier period from the timing t13 to timing t17.

In other words, this achieves amplification of the input data signal DQ with a large gain in a wide band and improvement in falling slew rate of the waveform of the output data signal DQ1 without increase in power current supplied to the input circuit 221. The data signal DQ2 transferred to the data latch 225 may thus have suppressed jitter at low power consumption.

As described above, in the semiconductor integrated circuit 132 according to the embodiment, the time constant providing circuit 24 is additionally arranged between the load circuit 22 and the intermediate node N5 in the second amplifier 20 in the comparator COMP1 of the input circuit 221. The time constant providing circuit 24 provides the time constant between the load circuit 22 and the intermediate node N5 for improvement in characteristics of signal transmission from the load circuit 22 to the intermediate node N5. This achieves amplification of the input data signal DQ with a large gain in a wide band and improvement in slew rate of the waveform of the output data signal DQ1 without increase in power current supplied to the input circuit 221. The data signal DQ2 transferred to the data latch 225 may thus have suppressed jitter at low power consumption. In other words, the semiconductor integrated circuit 132 may achieve suppression of both jitter and power consumption.

The resistance element R1 in the time constant providing circuit 24 may alternatively be a variable resistance element having the resistance value variable in accordance with a predetermined control signal. For example, a plurality of sets each including the resistance element and a switch connected in series is prepared and connected parallelly to constitute the resistance element R1 that may thus be configured as a variable resistance element.

Figure 10:
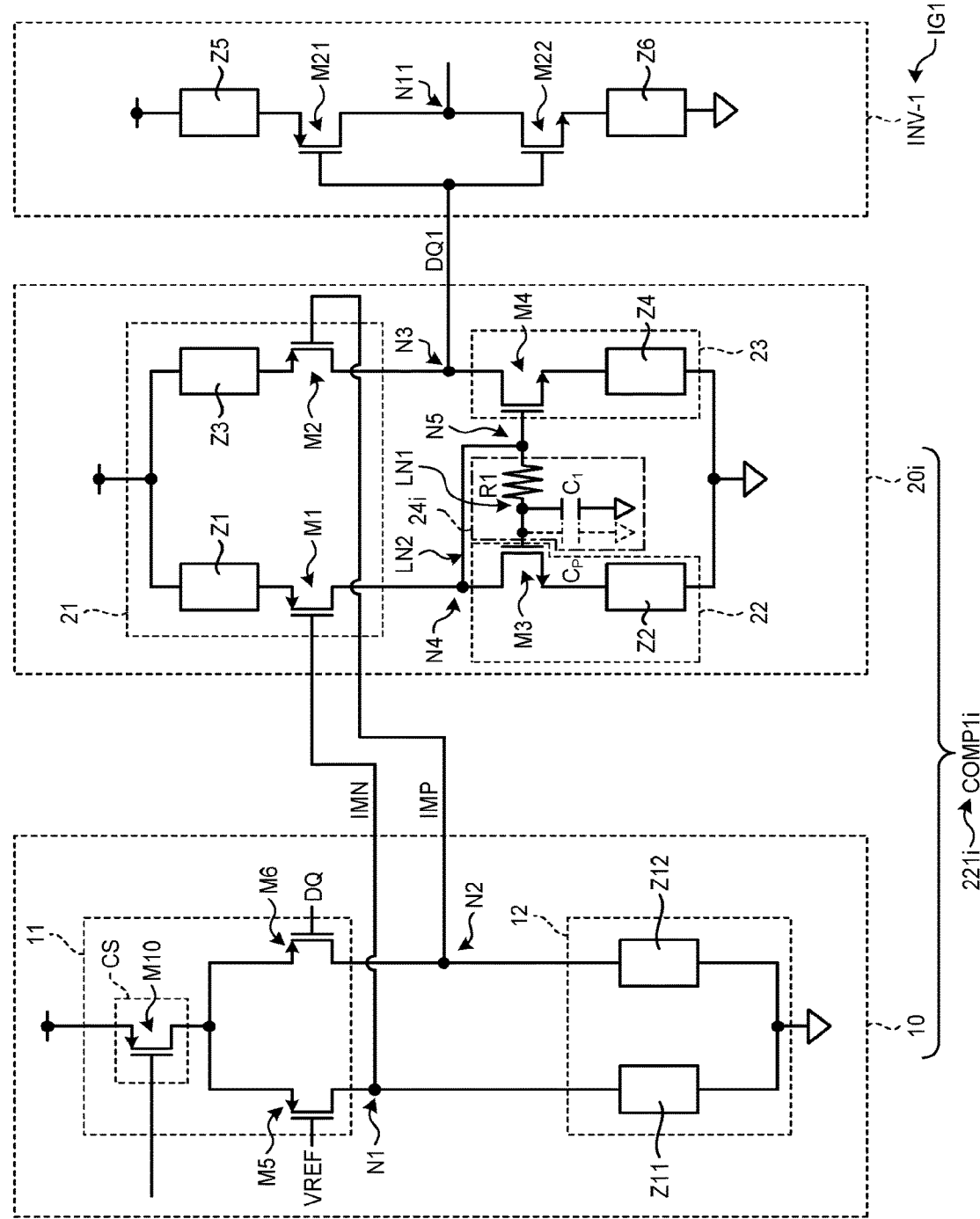
FIG. 10 is a diagram illustrating a configuration of an input circuit according to a first modification example of the embodiment.

Alternatively, in a second amplifier 20*i* of a comparator COMP1*i* in an input circuit 221*i*, a time constant providing circuit 24*i* may further include a capacitance element C1 as illustrated in FIG. 10. FIG. 10 is a diagram illustrating a configuration of the input circuit 221*i* according to a first modification example of the embodiment. The capacitance element C1 has a first end electrically connected to the line LN1, and a second end electrically connected to the ground potential. Also in this configuration, the time constant providing circuit 24*i* may provide the time constant between the load circuit 22 and the intermediate node N5 for improvement in characteristics of signal transmission from the load circuit 22 to the intermediate node N5.

Figure 11:
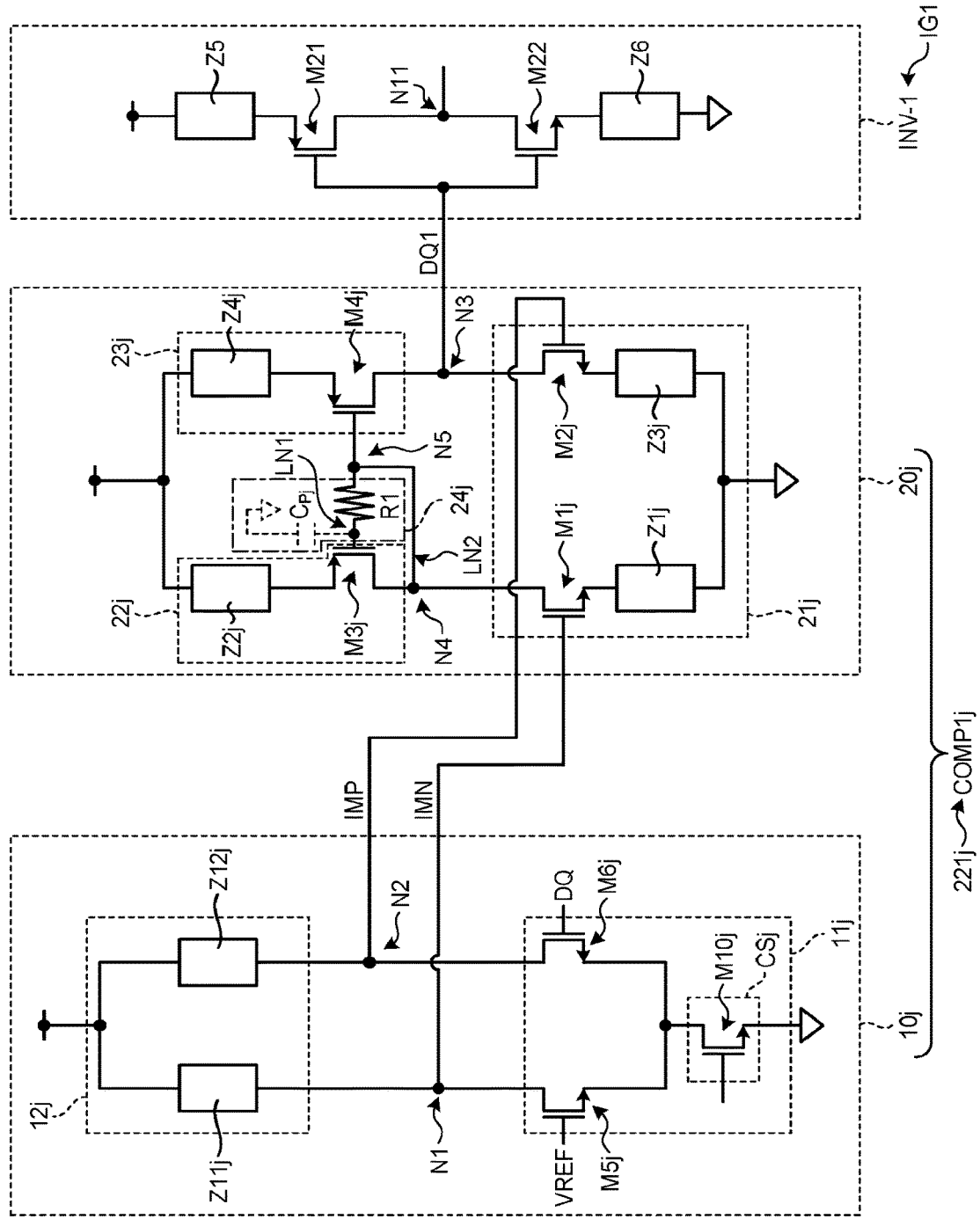
FIG. 11 is a diagram illustrating a configuration of an input circuit according to a second modification example of the embodiment.

Alternatively, in each of a first amplifier 10*j* and a second amplifier 20*j* of a comparator COMP1*j* in an input circuit 221*j*, the transistors may have reversed polarity in comparison to FIG. 5, as illustrated in FIG. 11. FIG. 11 is a diagram illustrating a configuration of the input circuit 221*j* according to a second modification example of the embodiment.

In the first amplifier 10*j*, each of a transistor M5*j* and a transistor M6*j* in a differential circuit 11*j* may be constituted by an NMOS transistor. A current source CSj may be constituted by a transistor M10*j* such as an NMOS transistor. The transistor M10*j* has a source electrically connected to the ground potential. The load circuit 12 includes an element Z11*j* and an element Z12*j* each having a second end electrically connected to the power potential.

In the second amplifier 20*j*, each of a transistor M1*j* and a transistor M2*j* in a differential circuit 21*j* may be constituted by an NMOS transistor. Each of an element Z1*j* and an element Z3*j* has a second end electrically connected to the ground potential. A transistor M3*j* in a load circuit 22*j* may be constituted by a PMOS transistor. An element Z2*j* has a second end electrically connected to the power potential. A transistor M4*j* in a load circuit 23*j* may be constituted by a PMOS transistor. An element Z4*j* has a second end electrically connected to the power potential. A time constant providing circuit 24*j* includes parasitic capacitance Cpj in place of the parasitic capacitance Cp (see FIG. 5). The parasitic capacitance Cpj is an equivalent capacitance component parasitically arranged between the line LN1, the transistor M3*j* and GND potential.

Also in this configuration, the time constant providing circuit 24*j* may provide the time constant between the load circuit 22*j* and the intermediate node N5 for improvement in characteristics of signal transmission from the load circuit 22*j* to the intermediate node N5.

Alternatively, the comparator COMP1 in the input circuit 221 may be obtained by combining the first amplifier 10 illustrated in FIG. 5 and the second amplifier 20*j* illustrated in FIG. 11. Also in this configuration, the time constant providing circuit 24*j* may provide the time constant between the load circuit 22*j* and the intermediate node N5 for improvement in characteristics of signal transmission from the load circuit 22*j* to the intermediate node N5.

Still alternatively, the comparator COMP1 in the input circuit 221 may be obtained by combining the first amplifier 10*j* illustrated in FIG. 11 and the second amplifier 20 illustrated in FIG. 5. Also in this configuration, the time constant providing circuit 24 may provide the time constant between the load circuit 22 and the intermediate node N5 for improvement in characteristics of signal transmission from the load circuit 22 to the intermediate node N5.

Figure 12:
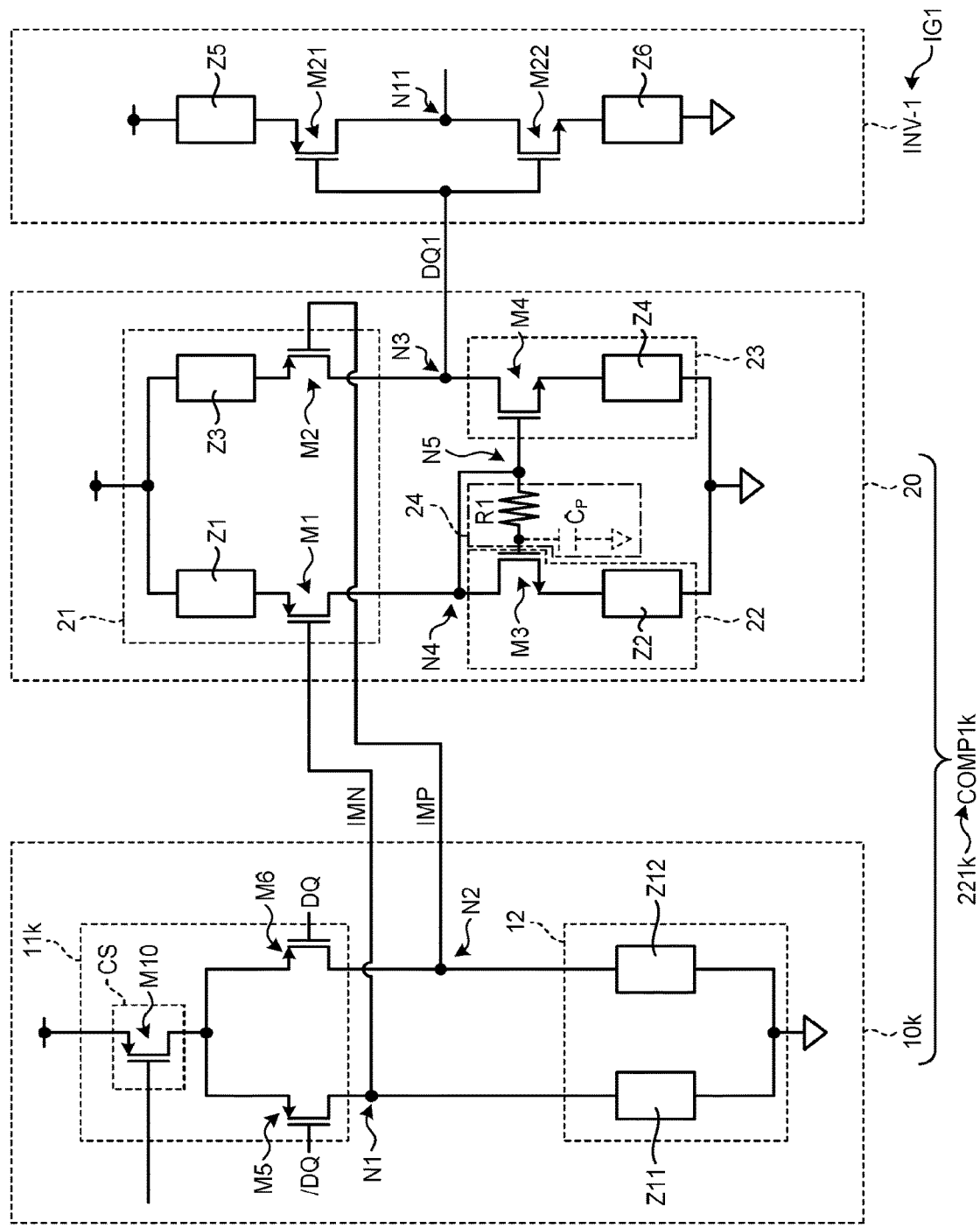
FIG. 12 is a diagram illustrating a configuration of an input circuit according to a third modification example of the embodiment.

Further alternatively as illustrated in FIG. 12, a first amplifier 10*k* may be of a type of differential input and differential output in a comparator COMP1*k* of an input circuit 221*k*. The first amplifier 10*k* includes a differential circuit 11*k* in place of the differential circuit 11 (see FIG. 5). In the differential circuit 11*k*, the gate of the transistor M5 receives a data signal /DQ in place of the reference signal VREF. The data signal /DQ is reversed in polarity with respect to the data signal DQ received by the gate of the transistor M6. For example, the first amplifier 10*k* raises the P-side signal IMP to be higher than the reference signal VREF and lowers the N-side signal IMN to be lower than the reference signal VREF in accordance with a fact that the data signal DQ is lower than the data signal /DQ. The first amplifier 10*k* lowers the P-side signal IMP to be lower than the reference signal VREF and raises the N-side signal IMN to be higher than the reference signal VREF in accordance with a fact that the data signal DQ is higher than the data signal /DQ. The first amplifier 10*k* thus generates differential signals IMP and IMN in accordance with differential signals DQ and /DQ, and supplies the second amplifier 20 with the differential signals DQ and /DQ. The second amplifier 20 operates similarly to the second amplifier according to the embodiment. Also in this configuration, the time constant providing circuit 24 may provide the time constant between the load circuit 22 and the intermediate node N5 for improvement in characteristics of signal transmission from the load circuit 22 to the intermediate node N5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   an input circuit including a first amplifier and a second amplifier electrically connected to the first amplifier, wherein
   the second amplifier includes
   a first transistor having a gate electrically connected to a first node of the first amplifier,
   a second transistor having a gate electrically connected to a second node of the first amplifier,
   a third transistor disposed adjacent to a drain of the first transistor,
   a fourth transistor disposed adjacent to a drain of the second transistor, and
   a time constant providing circuit electrically connected between (1) a gate of the third transistor and (2) a drain of the third transistor and a gate of the fourth transistor, and
   the time constant providing circuit includes a resistance element having a first end electrically connected to the gate of the third transistor and a second end electrically connected to the drain of the third transistor and the gate of the fourth transistor.

2. The semiconductor integrated circuit according to claim 1, wherein the time constant providing circuit further includes a capacitance element having a first end electrically connected to the gate of the third transistor.

3. The semiconductor integrated circuit according to claim 2, wherein the third transistor and the fourth transistor constitute a current mirror circuit via the resistance element and the capacitance element.

4. The semiconductor integrated circuit according to claim 2, wherein the resistance element is a variable resistance element.

5. The semiconductor integrated circuit according to claim 1, wherein the third transistor and the fourth transistor constitute a current mirror circuit via the time constant providing circuit.

6. The semiconductor integrated circuit according to claim 1, wherein the third transistor and the fourth transistor constitute a current mirror circuit via the resistance element.

7. The semiconductor integrated circuit according to claim 1, wherein the resistance element is a variable resistance element.

8. The semiconductor integrated circuit according to claim 1, wherein
 each of the first transistor and the second transistor is a PMOS transistor, and
 each of the third transistor and the fourth transistor is an NMOS transistor.

9. The semiconductor integrated circuit according to claim 1, wherein
 each of the first transistor and the second transistor is an NMOS transistor, and
 each of the third transistor and the fourth transistor is a PMOS transistor.

10. The semiconductor integrated circuit according to claim 1, wherein the first transistor and the second transistor constitute a differential pair.

11. A semiconductor storage device comprising:
 a memory cell array; and
 the semiconductor integrated circuit according to claim 1, disposed around the memory cell array.

12. A semiconductor integrated circuit comprising:
 an input circuit including a first amplifier and a second amplifier electrically connected to the first amplifier, wherein
 the second amplifier includes
  a first transistor having a gate electrically connected to a first node of the first amplifier,
  a second transistor having a gate electrically connected to a second node of the first amplifier,
  a third transistor disposed adjacent to a drain of the first transistor,
  a fourth transistor disposed adjacent to a drain of the second transistor, and
  a time constant providing circuit electrically connected between (1) a gate of the third transistor and (2) a drain of the third transistor and a gate of the fourth transistor, and
 the first amplifier includes
  a fifth transistor having a drain electrically connected to the first node and a gate that receives a reference signal, and
  a sixth transistor having a drain electrically connected to the second node, and a gate that receives a data signal.

13. The semiconductor integrated circuit according to claim 12, wherein
 each of the first transistor and the second transistor is a PMOS transistor,
 each of the third transistor and the fourth transistor is an NMOS transistor, and
 each of the fifth transistor and the sixth transistor is a PMOS transistor.

14. The semiconductor integrated circuit according to claim 12, wherein
 the first transistor and the second transistor constitute a differential pair, and
 the fifth transistor and the sixth transistor constitute a differential pair.

15. A semiconductor integrated circuit comprising:
 an input circuit including a first amplifier and a second amplifier electrically connected to the first amplifier, wherein
 the second amplifier includes
  a first transistor having a gate electrically connected to a first node of the first amplifier,
  a second transistor having a gate electrically connected to a second node of the first amplifier,
  a third transistor disposed adjacent to a drain of the first transistor,
  a fourth transistor disposed adjacent to a drain of the second transistor, and
  a time constant providing circuit electrically connected between (1) a gate of the third transistor and (2) a drain of the third transistor and a gate of the fourth transistor, and
 the first amplifier includes
  a fifth transistor having a drain electrically connected to the first node and a gate that receives a first data signal, and
  a sixth transistor having a drain electrically connected to the second node, and a gate that receives a second data signal.

16. The semiconductor integrated circuit according to claim 15, wherein
 each of the first transistor and the second transistor is an NMOS transistor,
 each of the third transistor and the fourth transistor is a PMOS transistor, and
 each of the fifth transistor and the sixth transistor is an NMOS transistor.

17. The semiconductor integrated circuit according to claim 15, wherein
 the first transistor and the second transistor constitute a differential pair, and
 the fifth transistor and the sixth transistor constitute a differential pair.

18. A semiconductor integrated circuit comprising:
 an input circuit including a first amplifier and a second amplifier electrically connected to the first amplifier, and
 an inverter electrically connected to the second amplifier, wherein
 the second amplifier includes
  a first transistor having a gate electrically connected to a first node of the first amplifier,
  a second transistor having a gate electrically connected to a second node of the first amplifier,
  a third transistor disposed adjacent to a drain of the first transistor,
  a fourth transistor disposed adjacent to a drain of the second transistor, and
  a time constant providing circuit electrically connected between (1) a gate of the third transistor and (2) a drain of the third transistor and a gate of the fourth transistor, and
 the inverter includes an input node electrically connected to the drain of the second transistor and a drain of the fourth transistor.

* * * * *